US009735354B2

(12) United States Patent
Redaelli et al.

(10) Patent No.: US 9,735,354 B2
(45) Date of Patent: *Aug. 15, 2017

(54) FORMING RESISTIVE RANDOM ACCESS MEMORIES TOGETHER WITH FUSE ARRAYS

(71) Applicant: Micron Technology, Inc., Boise, ID (US)

(72) Inventors: Andrea Redaelli, Casatenovo (IT); Agostino Pirovano, Milan (IT); Umberto Maria Meotto, Rivoli (IT); Giorgio Servalli, Fara Gera d'Adda (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/153,293

(22) Filed: May 12, 2016

(65) Prior Publication Data

US 2016/0260897 A1   Sep. 8, 2016

Related U.S. Application Data

(60) Continuation of application No. 14/738,453, filed on Jun. 12, 2015, now Pat. No. 9,356,237, which is a
(Continued)

(51) Int. Cl.
*H01L 45/00* (2006.01)
*H01L 27/24* (2006.01)
*H01L 23/525* (2006.01)

(52) U.S. Cl.
CPC .......... *H01L 45/06* (2013.01); *H01L 23/5256* (2013.01); *H01L 27/2445* (2013.01);
(Continued)

(58) Field of Classification Search
CPC . H01L 45/06; H01L 45/1233; H01L 27/2463; H01L 23/5256
See application file for complete search history.

(56) References Cited

U.S. PATENT DOCUMENTS 6,291,836 B1 * 9/2001 Kramer ................ G11C 16/02
257/209
7,778,069 B2   8/2010 Matsuzaki et al.
(Continued)

FOREIGN PATENT DOCUMENTS

DE   EP2045814 A1   4/2009
JP   58-110053   6/1983
(Continued)

OTHER PUBLICATIONS

Cited in Search & Exam report of Aug. 2, 2012 for Singapore Appln No. 201105174-5.
(Continued)

*Primary Examiner* — Jaehwan Oh
(74) *Attorney, Agent, or Firm* — Dorsey & Whitney LLP

(57) ABSTRACT

A resistive random access memory array may be formed on the same substrate with a fuse array. The random access memory and the fuse array may use the same active material. For example, both the fuse array and the memory array may use a chalcogenide material as the active switching material. The main array may use a pattern of perpendicular sets of trench isolations and the fuse array may only use one set of parallel trench isolations. As a result, the fuse array may have a conductive line extending continuously between adjacent trench isolations. In some embodiments, this continuous line may reduce the resistance of the conductive path through the fuses.

20 Claims, 18 Drawing Sheets

Related U.S. Application Data division of application No. 14/066,308, filed on Oct. 29, 2013, now Pat. No. 9,136,471, which is a continuation of application No. 12/849,864, filed on Aug. 4, 2010, now Pat. No. 8,569,734.

(52) U.S. Cl.
CPC .......... *H01L 27/2463* (2013.01); *H01L 45/12* (2013.01); *H01L 45/126* (2013.01); *H01L 45/1226* (2013.01); *H01L 45/1233* (2013.01); *H01L 45/144* (2013.01); *H01L 45/16* (2013.01); *H01L 45/1675* (2013.01); *H01L 45/1683* (2013.01)

(56) References Cited

U.S. PATENT DOCUMENTS

| | | | |
|---|---|---|---|
| 8,120,006 B2 | 2/2012 | Kim et al. | |
| 8,569,734 B2* | 10/2013 | Redaelli | H01L 27/2445 257/209 |
| 9,136,471 B2 | 9/2015 | Redaelli et al. | |
| 2006/0233082 A1* | 10/2006 | Lee | G11C 13/00 369/59.23 |
| 2006/0266082 A1 | 11/2006 | Bush et al. | |
| 2007/0081410 A1 | 4/2007 | Bernstein et al. | |
| 2007/0189053 A1 | 8/2007 | Pellizzer et al. | |
| 2008/0001176 A1 | 1/2008 | Gopalakrishnan et al. | |
| 2008/0007986 A1 | 1/2008 | Jeong et al. | |
| 2008/0316789 A1 | 12/2008 | Fredeman et al. | |
| 2009/0010040 A1 | 1/2009 | Takase | |
| 2009/0065761 A1 | 3/2009 | Chen et al. | |
| 2009/0230505 A1 | 9/2009 | Dennison | |
| 2010/0006816 A1* | 1/2010 | Magistretti | H01L 27/1022 257/5 |
| 2010/0163833 A1 | 7/2010 | Borghi et al. | |
| 2014/0048763 A1 | 2/2014 | Redaelli et al. | |

FOREIGN PATENT DOCUMENTS

| | | |
|---|---|---|
| JP | 2010-123987 A | 6/2010 |
| WO | WO2006/031503 A1 | 3/2006 |

OTHER PUBLICATIONS

Office Action dated Nov. 12, 2012 received for KR Appln No. 10-2011-77489.

Chinese Office Action for Appl No. 201110225660.6 dated Aug. 23, 2013.

Notice of Rejection for Appl No. 2011-163317 mailed Jul. 9, 2013 mailed Jul. 9, 2013.

Notice of Rejection Grounds for JP Appl No. 2011-163317, mailed Mar. 4, 2014.

Second Office Action for Appl No. CN201110225660.6, Issued Feb. 17, 2014.

Pirovano, Agostino et al., Non-final Office Action issued by German Patent and Trademark Office on May 8, 2012 for German Patent Application No. 10 2011 109 359.5.

* cited by examiner

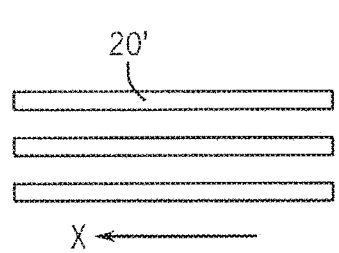
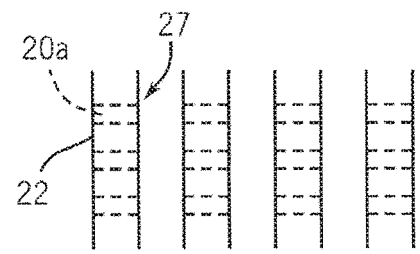
FIG. 24    FIG. 25
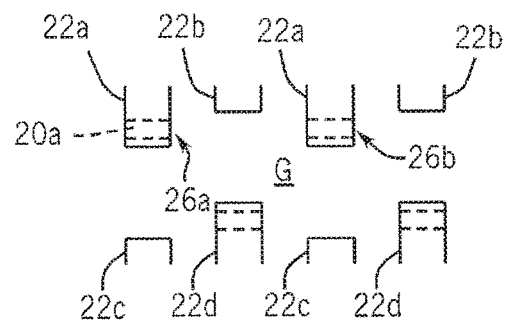
FIG. 26
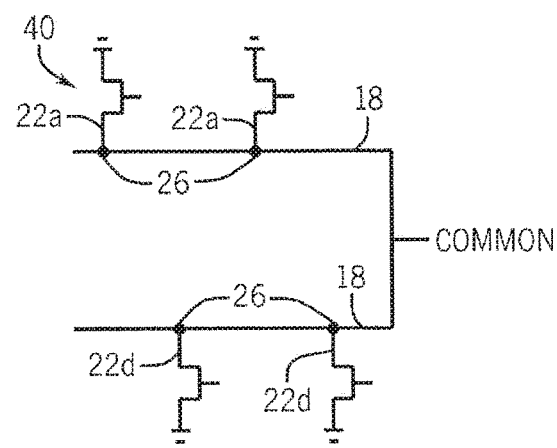
FIG. 29

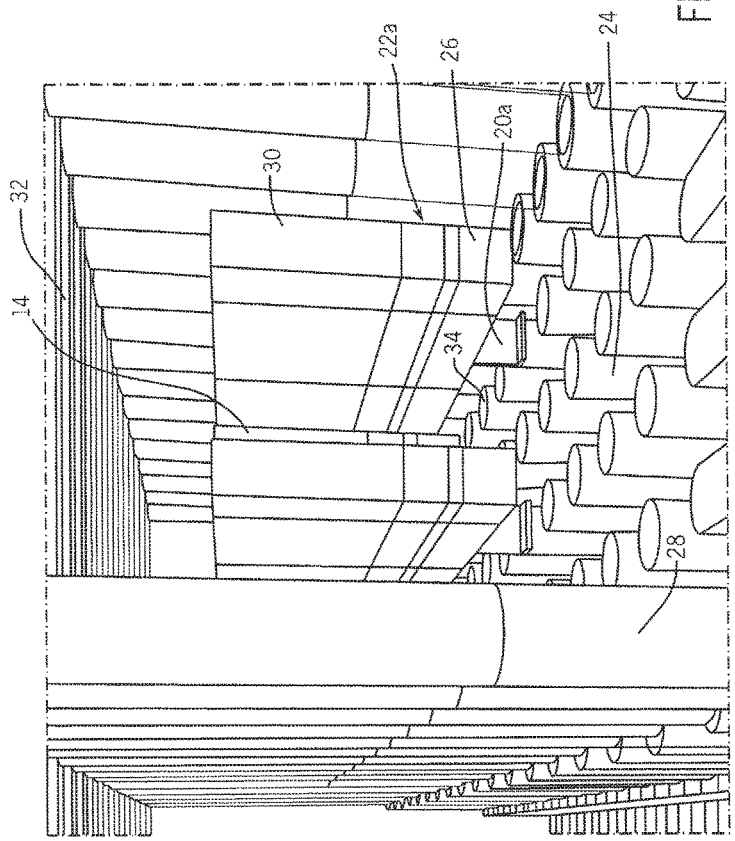

FORMING RESISTIVE RANDOM ACCESS MEMORIES TOGETHER WITH FUSE ARRAYS

CROSS-REFERENCE TO RELATED APPLICATIONS

This application is a continuation of U.S. patent application Ser. No. 14/738,453, filed Jun. 12 2015, and issued as U.S. Pat. No. 9,356,237 on May 31, 2016, which is a divisional of U.S. patent application Ser. No. 14/066,308 filed Oct. 29, 2013, and issued as U.S. Pat. No. 9,136,471 on Sep. 15, 2015, which is a continuation of U.S. patent application Ser. No. 12/849,864 filed on Aug. 4, 2010 and issued as U.S. Pat. No. 8,569,734 on Oct. 29, 2013. The aforementioned applications and patents are incorporated herein by reference, in their entirety, and for any purpose.

BACKGROUND

This relates generally to resistive random access memories (ReRAMs).

ReRAM relies on materials that can be electrically switched between a higher conductive state and a lower conductive state several times. One type of ReRAM, a phase change memory, uses phase change materials, i.e., materials that may be electrically switched between a generally amorphous and a generally crystalline state. One type of phase change memory element utilizes a phase change material that may be, in one application, electrically switched between a structural state of generally amorphous and generally crystalline local order or between different detectable states of local order across the entire spectrum between completely amorphous and completely crystalline states.

One time programmable fuses may be used in conjunction with a phase change memory array. For example, fuses may be programmed permanently to store information which should not be changed. This information may include trimming values set during manufacture, microcode, and redundancy addresses to replace defective memory elements with replacement memory elements, to mention a few examples.

The easiest solution to heat fuses in conjunction with the phase change memory array is to permanently blow a phase change storage element. This can be done with high current pulses delivered to the phase change memory cell in reverse polarity.

Because it operates differently, the fuse array must include structural differences over the phase change memory elements. In particular, the reverse polarity and the high current for blowing fuses results in specific drivers and layout. As a result, the fabrication complexity may be increased by the inclusion of a fuse array on the same die with a memory array.

BRIEF DESCRIPTION OF THE DRAWINGS

FIG. 24 is a more enlarged, partial top plan view at the main array in accordance with one embodiment at an early stage of manufacture;

FIG. 25 is a more enlarged, top plan view showing strips that may be patterned to ultimately form heaters of the main array in accordance with one embodiment, at a subsequent stage to that shown in FIG. 24;

FIG. 26 is an enlarged, top plan view of the fuse array at the stage of manufacture also shown in FIG. 25, in accordance with one embodiment;

FIG. 28 is a greatly enlarged, perspective view of the fuse array in accordance with some embodiments of the present invention; and FIG. 29 is a schematic depiction for one embodiment of the present invention.

DETAILED DESCRIPTION

Figure 1:
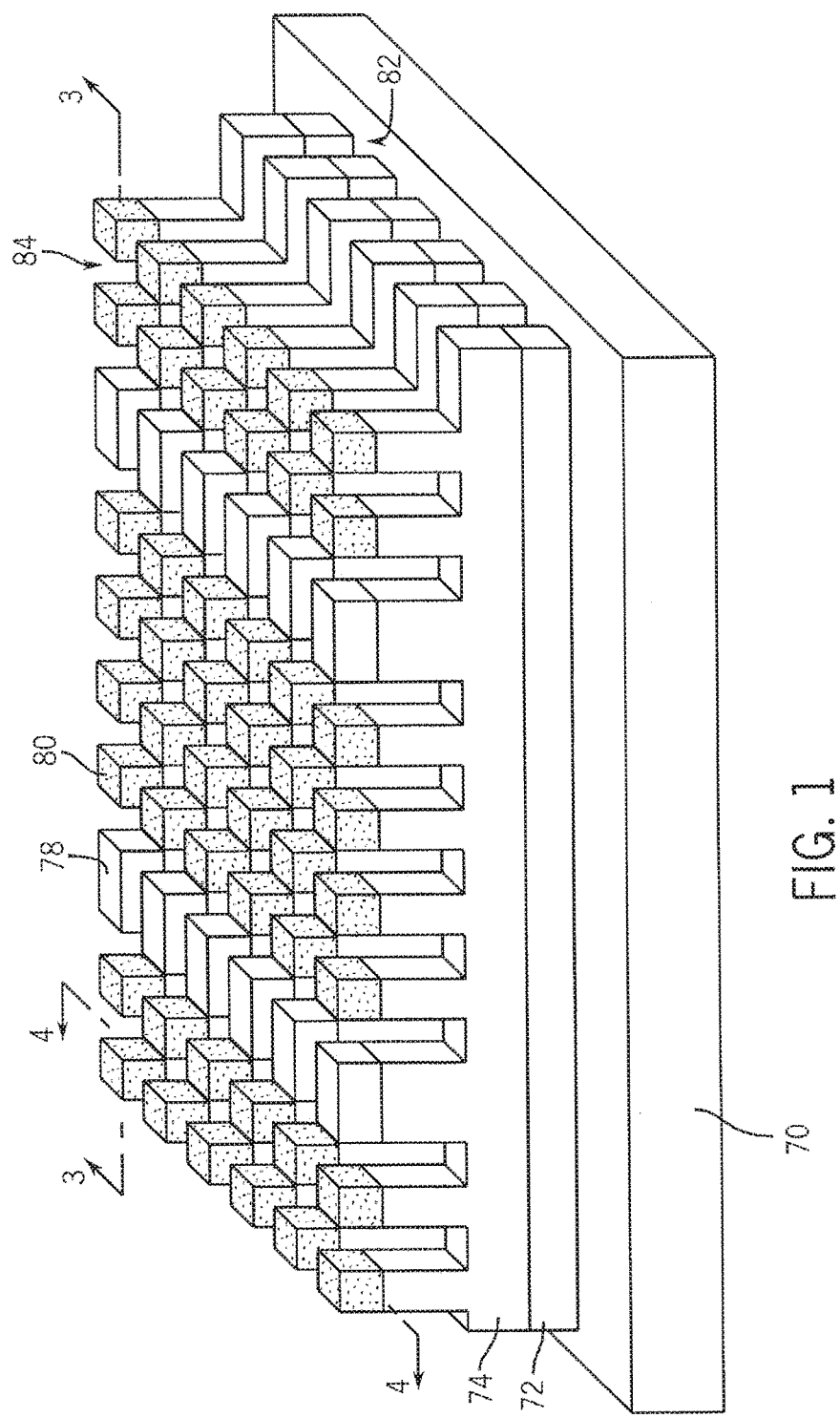
FIG. 1 is an enlarged, perspective view of a main array in accordance with one embodiment of the present invention.

A main resistive random access memory array (FIG. 1) and a fuse array (FIG. 2) may be formed using the same or substantially the same steps on the same semiconductor substrate. Referring to FIG. 1, the semiconductor substrate 70 may have a P-type collector 72 in one embodiment. Over the P-type collector 72 may be an N-type base or wordline 74 in one embodiment. Thus, the wordlines run from left to right in the figure. The bitlines run into the page and include a plurality of P-type emitters 80. Base contacts 78 separate sets of four emitters in the row direction in one embodiment. Thus, deeper trench isolations 82 extend in the row direction, while shallower trench isolations 84 extend in the bitline direction. While not depicted in FIG. 1, the deeper and shallower trench isolations 82 and 84 may be filled with a dielectric, such as silicon dioxide.

The emitters 80 and base contacts 78 may be formed by ion implantation with appropriate masking in one embodiment. The mask may be opened to form the appropriate conductivity type at the appropriate locations. Conductivity types other than those described herein may be used. Other trench depths and orientations are possible in other embodiments.

Figure 2:
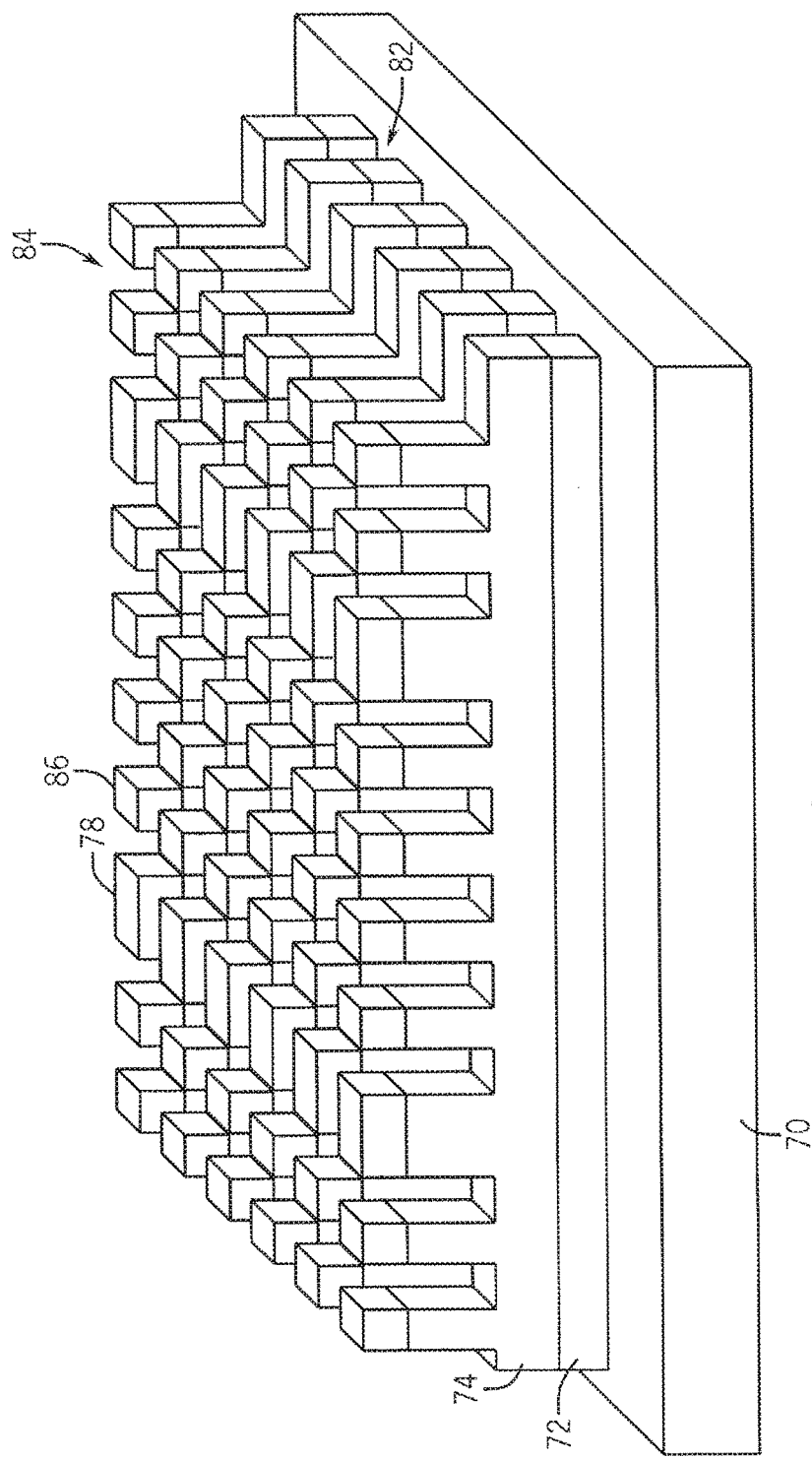
FIG. 2 is an enlarged, perspective view of a fuse array in accordance with one embodiment of the present invention.

Referring to FIG. 2, the fuse array may have the same arrangement of trench isolations 82 and 84 that are formed at the same time, using the same sequence of semiconductor processing operations, as used to form the corresponding trenches for the main array shown in FIG. 1, in one embodiment. As in the main array, the fuse array may also include base contacts 78. However, the fuse array may include fuse contacts 86 instead of emitters. In one embodiment, the base contacts 78 and fuse contacts 86 are N+ doped and may be formed at the same process step.

FIGS. 3-12 and 15-18 show the fabrication of the main array, with the odd numbered figures being row direction cross-sections and the even numbered figures being cross-sections in the bitline direction. In the illustrated embodiment, the main array is a phase change memory, but other resistive random access memories may also be used.

Figure 4:
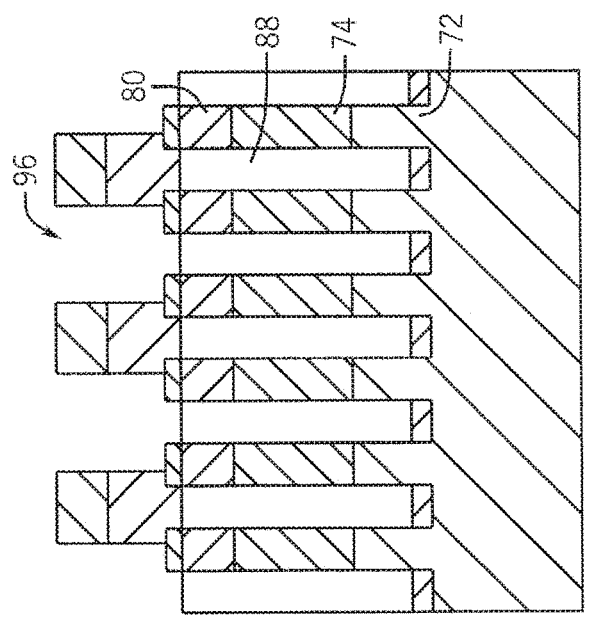
FIG. 4 is an enlarged, cross-sectional view taken generally along the line 4-4 in FIG. 1.
Figure 3:
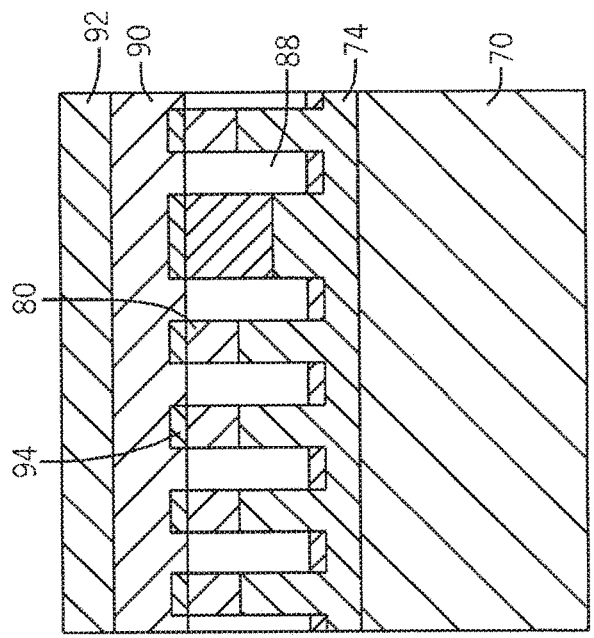
FIG. 3 is a cross-section through the main array taken generally along the line 3-3 in FIG. 1 taken along the row or wordline.

In FIGS. 3 and 4, a dielectric 88 fills the deeper and shallower trenches 82 and 84. A silicon nitride layer 90 may be fanned under a silicon oxide layer 92. However, other dielectrics may also be used. In one embodiment, silicide plus tungsten plugs 94 may be formed above the silicon regions 78, 80 and 86 and under the silicon nitride layer 90. Note that the same plugs may be used in the main array and the fuse array. Thus, while the dielectric layers 90 and 92 are continuous in the row direction, they are trenched, as seen in the bitline direction in FIG. 4 in one embodiment. Namely, the trenches 96 may nm in the row direction, leaving a dielectric layer spanning each pair of two emitters 80.

Figure 6:
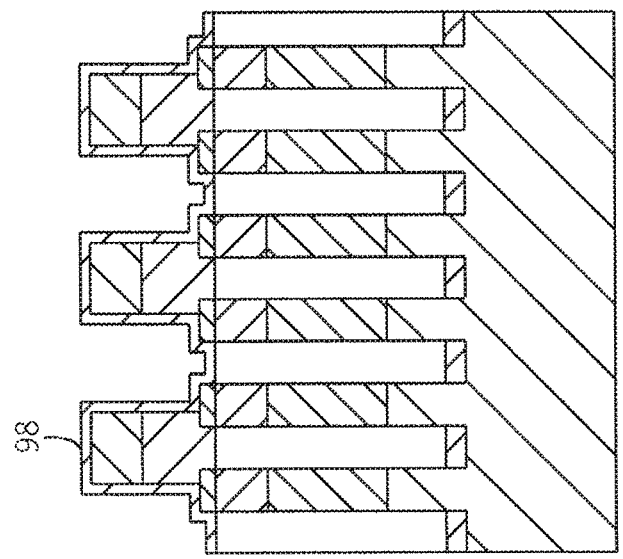
FIG. 6 is an enlarged, cross-sectional view corresponding to FIG. 4 at a subsequent stage in accordance with one embodiment.
Figure 5:
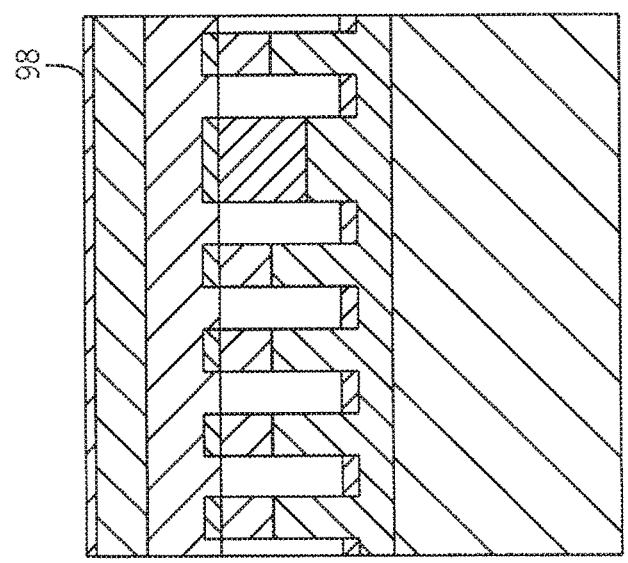
FIG. 5 is an enlarged, cross-sectional view at a subsequent stage to that shown in FIG. 3 in accordance with one embodiment.

Then, referring to FIGS. 5 and 6, the structures may be covered by a material used to form heaters 98. For example, titanium nitride composites may be utilized for this purpose. The heaters 98 may cover the dielectric material and the trenches between the dielectric material, as shown in FIGS. 5 and 6.

Figure 7:
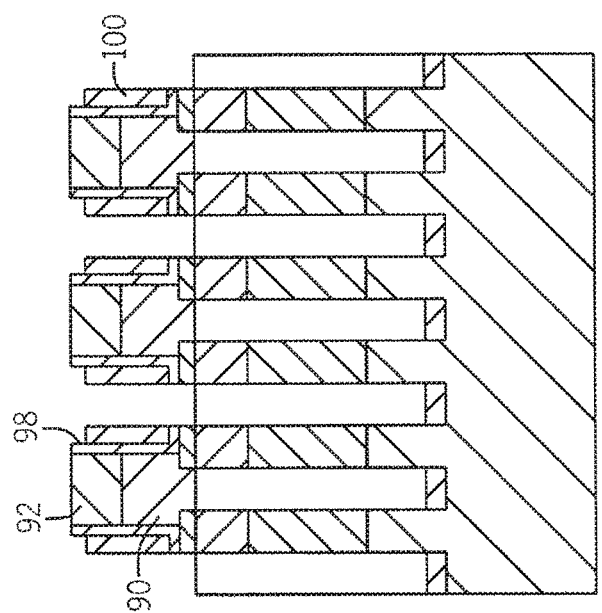
FIG. 7 is an enlarged, cross-sectional view at a subsequent stage corresponding to FIG. 5 in accordance with one embodiment.
Figure 8:
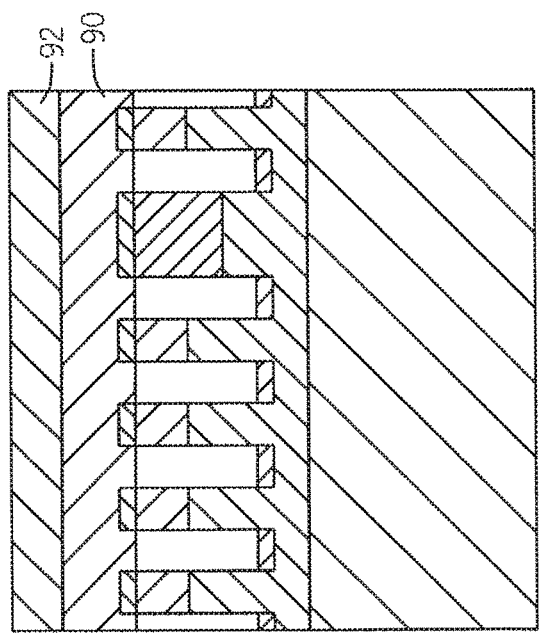
FIG. 8 is an enlarged, cross-sectional view at a subsequent stage corresponding to FIG. 6 in accordance with one embodiment.

Then, as shown in FIGS. 7 and 8, the heater 98 material is removed from the tops of the dielectric layers 90 and 92 so that only the upstanding vertical portions remain, as indicated at 98 in FIG. 8. Thus, the L-shaped remnants 98 mn in the row direction. A nitride material 100 may be deposited over the resulting structure and then trenched, as indicated, to form sidewall spacers shown in FIG. 8.

Figure 10:
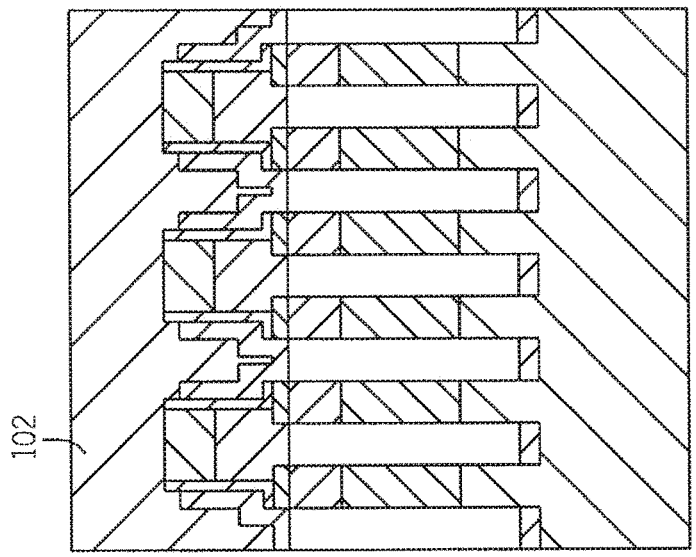
FIG. 10 is an enlarged, cross-sectional view at a subsequent stage to that shown in FIG. 8 in accordance with one embodiment.
Figure 9:
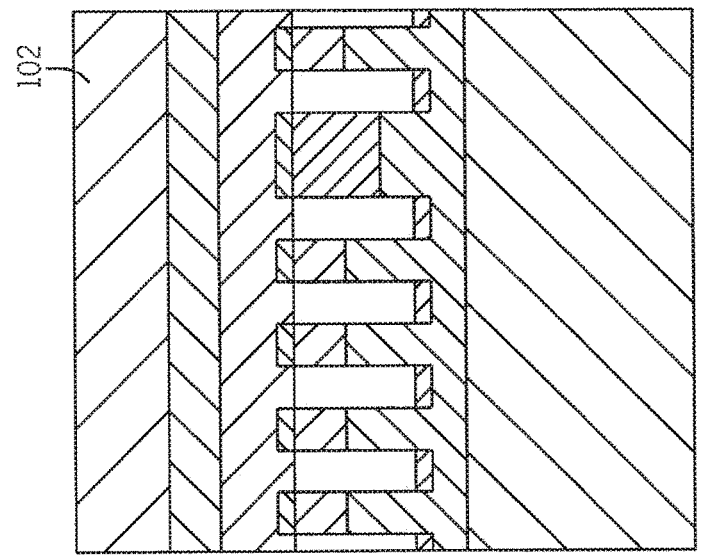
FIG. 9 is an enlarged, cross-sectional view at a subsequent stage to that shown in FIG. 7 in accordance with one embodiment.

Then, the structure shown in FIG. 8 may be covered by still another dielectric layer 102 which, in one embodiment, may be silicon dioxide, as shown in FIGS. 9 and 10.

Figure 12:
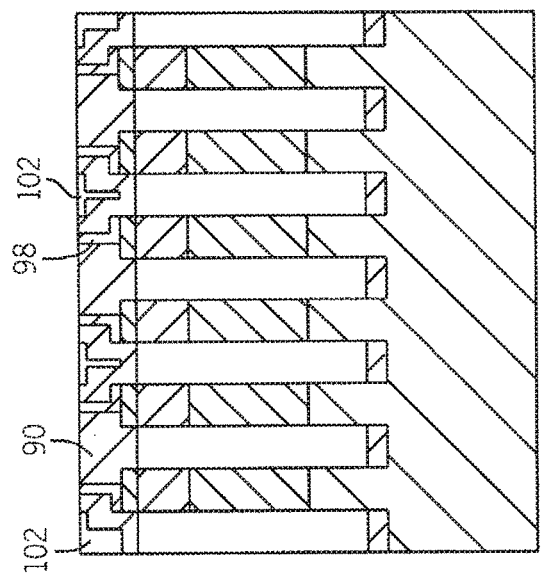
FIG. 12 is an enlarged, cross-sectional view at a subsequent stage to that shown in FIG. 10 in one embodiment.
Figure 11:
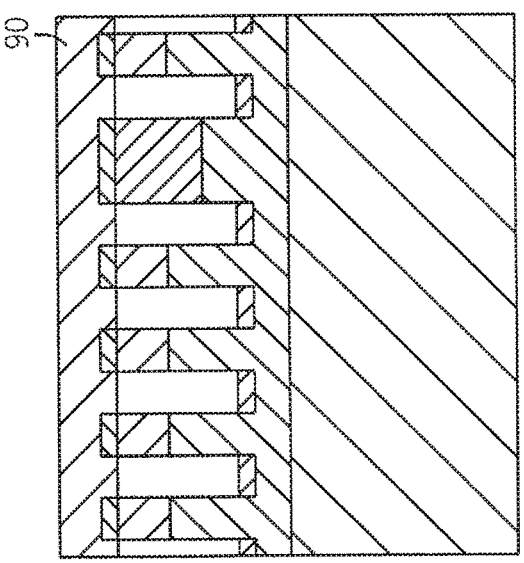
FIG. 11 is an enlarged, cross-sectional view at a subsequent stage to that shown in FIG. 9 in one embodiment.

Moving to FIG. 11, the structure may be planarized to remove the upper part of the dielectric layer 102, creating the planar structure shown in FIG. 12. The planarization may go all the way down to the nitride layer 90 in one embodiment.

Figure 13:
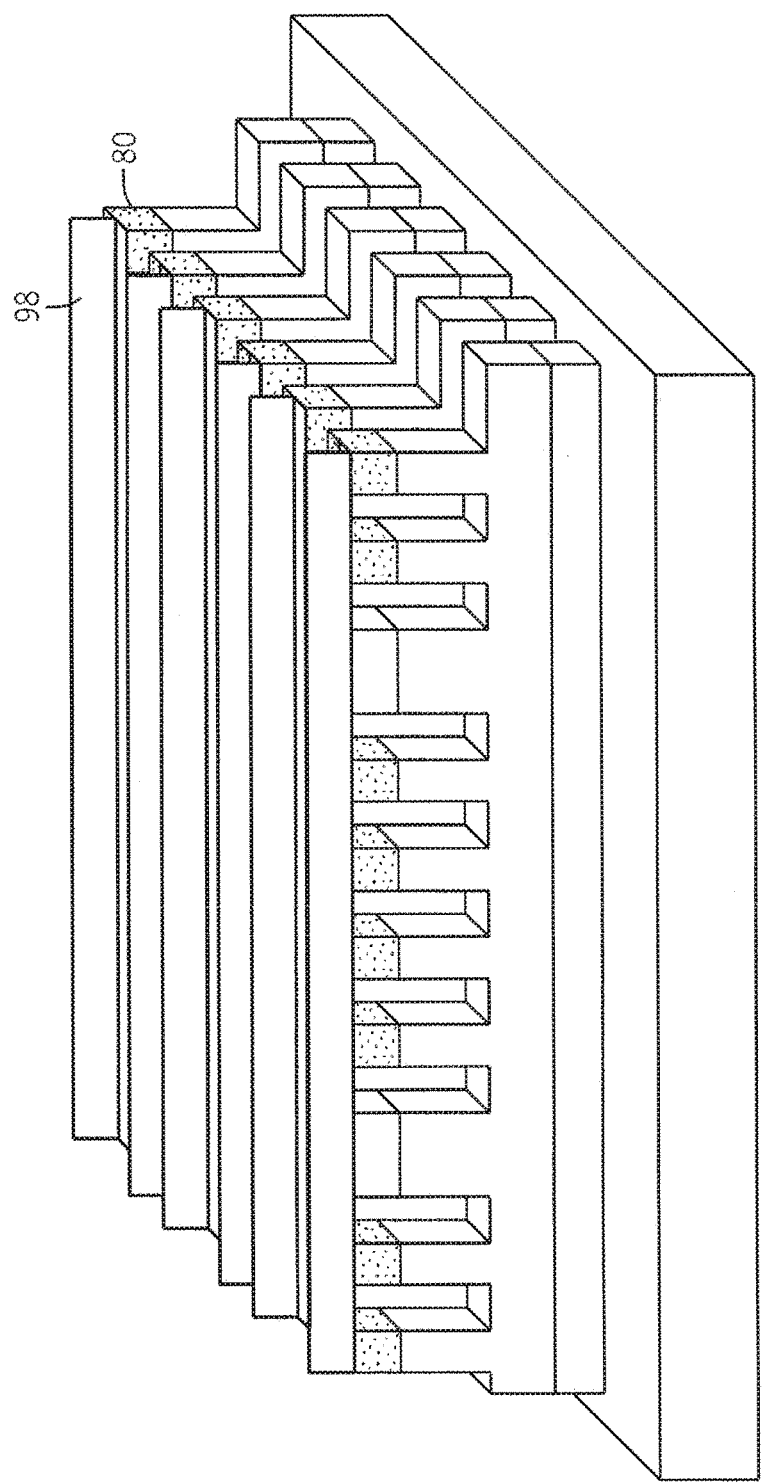
FIG. 13 is a perspective view at a subsequent stage to that shown in FIG. 1 in accordance with one embodiment.

Referring to FIG. 13, the resulting heaters 98 may be L-shaped and may run in the row direction. Adjacent rows may have L-shaped heaters 98 that face in opposite directions. The heaters 98 are further defined as a result of an ensuing self-aligned etch of a chalcogenide bitline which actually occurs subsequently in the process flow, but the heaters are shown here to illustrate the L-shape in advance of the chalcogenide bitline etching step. The heaters 98 are positioned in the main array on the emitters 80.

Figure 14:
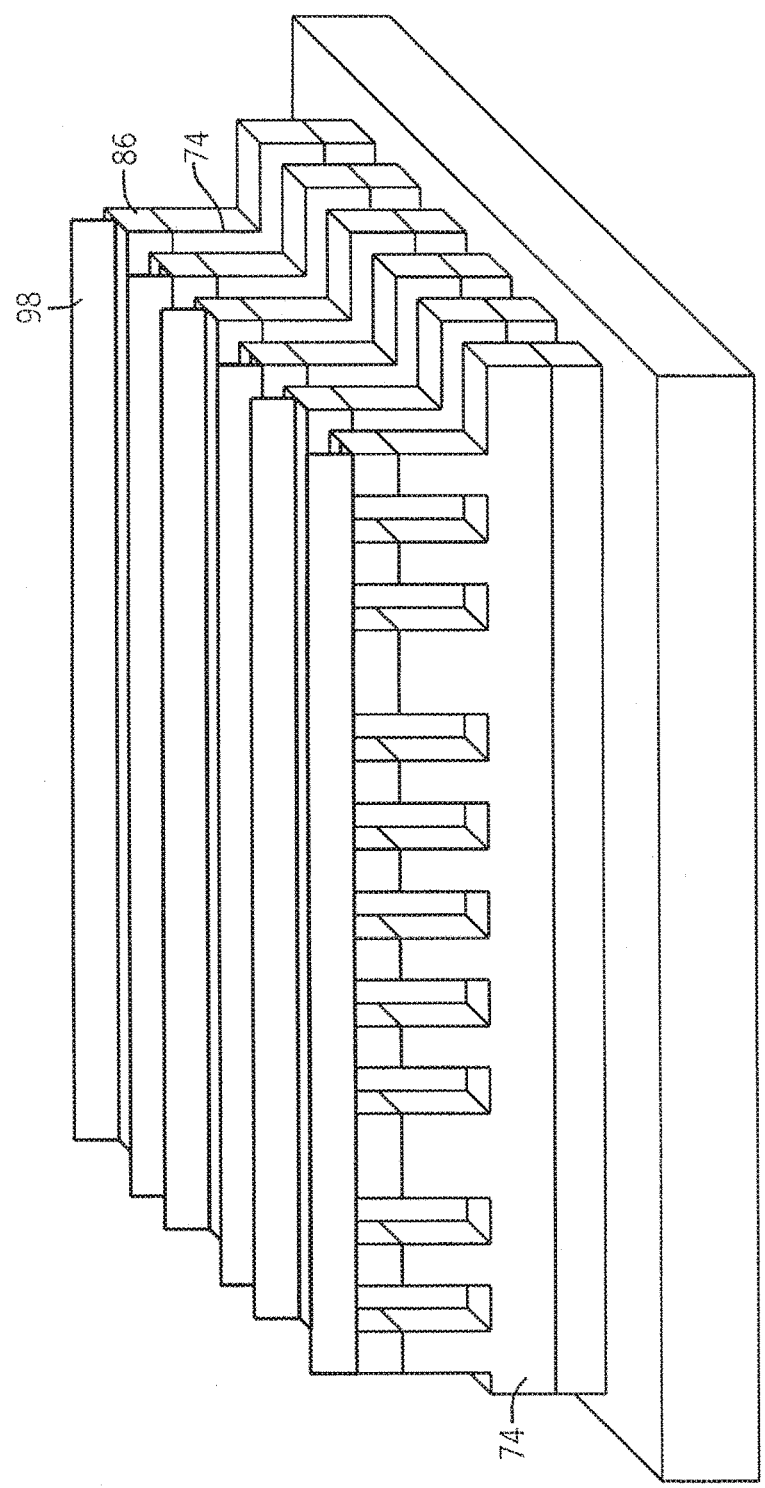
FIG. 14 is an enlarged, perspective view at a subsequent stage to that shown in FIG. 2 in accordance with one embodiment.

FIG. 14 shows the heaters 98 for the fuse array. In this case, the heaters 98 are positioned on top of the fuse contacts 86 with no difference with respect to the steps employed for the heater formation in the main array as described in FIGS. 3-12. In this case no bipolar transistor is present below the heater and the bottom of the heater element is in direct electrical contact with the N-doped silicon pillars of the base 74.

Figure 15:
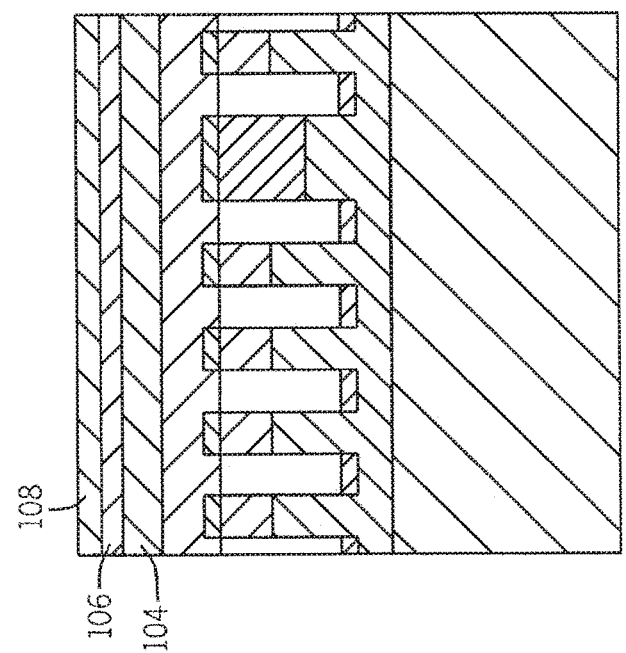
FIG. 15 is an enlarged, cross-sectional view at a stage subsequent that shown in FIG. 9 in accordance with one embodiment.
Figure 18:
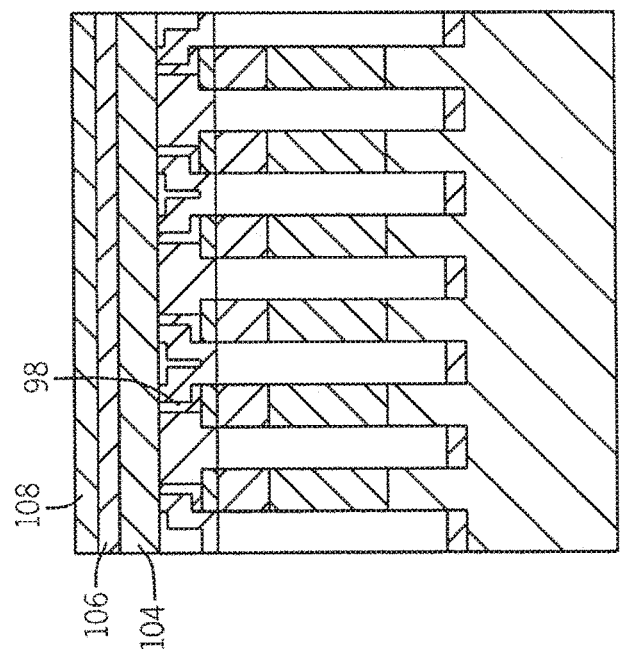
FIG. 18 is an enlarged, cross-sectional view corresponding to FIG. 16 at a subsequent stage in accordance with one embodiment.

Continuing with FIG. 15, a series of layers are added including a chalcogenide layer 104 in the case of a phase change memory embodiment. The chalcogenide layer 104 may be any material suitable for forming a phase change memory including the so called GST (germanium, antimony, tellurium) material. In some embodiments, over the phase change or chalcogenide layer 104 may be a metallic cap 106 which, in one embodiment, may be titanium nitride. Next, still another metal layer may be deposited, as indicated at 108. The layer 108, in one embodiment, may be tungsten to increase bitline conductivity.

Figure 16:
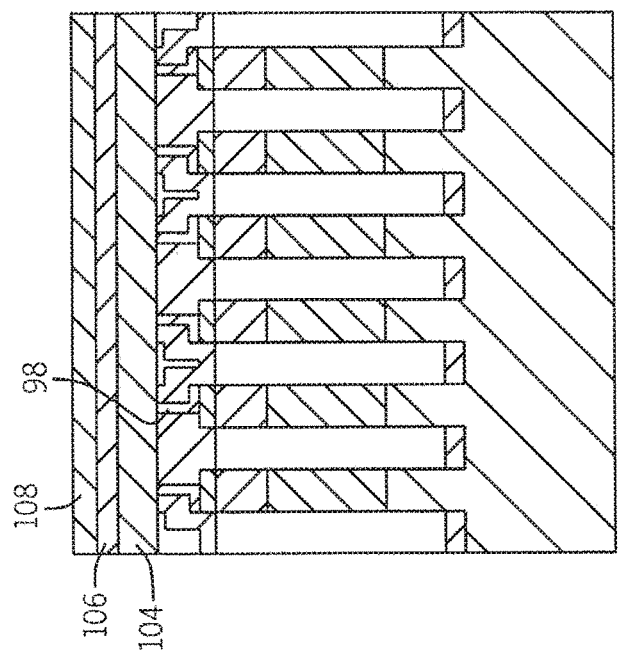
FIG. 16 is an enlarged, cross-sectional view at a stage subsequent to that shown in FIG. 12 in accordance with one embodiment.

Referring to FIG. 16, the chalcogenide layer 104 makes contact with the heaters 98 at their upper ends.

Figure 17:
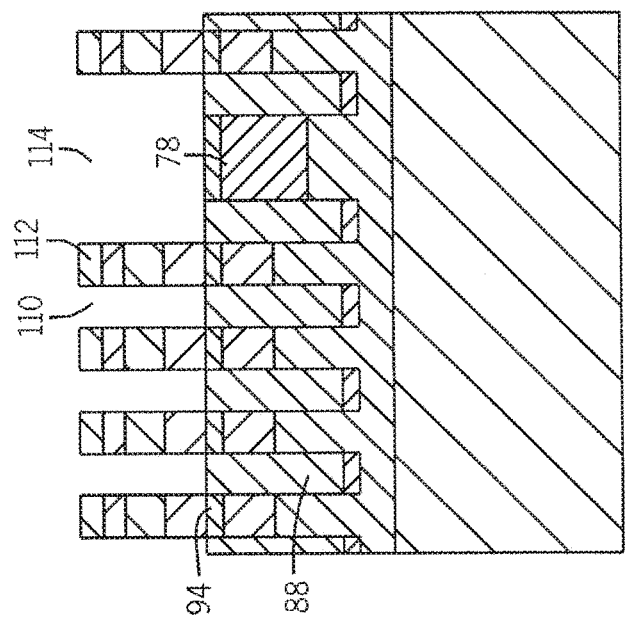
FIG. 17 is an enlarged, cross-sectional view at a stage subsequent to that shown in FIG. 15 in accordance with one embodiment.

The bitline definition step involves etching to define the bitlines, as shown in the wordline direction of FIG. 17. The resulting trenches 110 nm in the bitline direction and define bitlines 112 running into the page in FIG. 17 and across the page in FIG. 18, which is the bitline direction. This is the self-aligned etch of the bitline down to the tungsten plugs 94. A larger opening 114 is formed over the base contacts 78.

Figure 19:
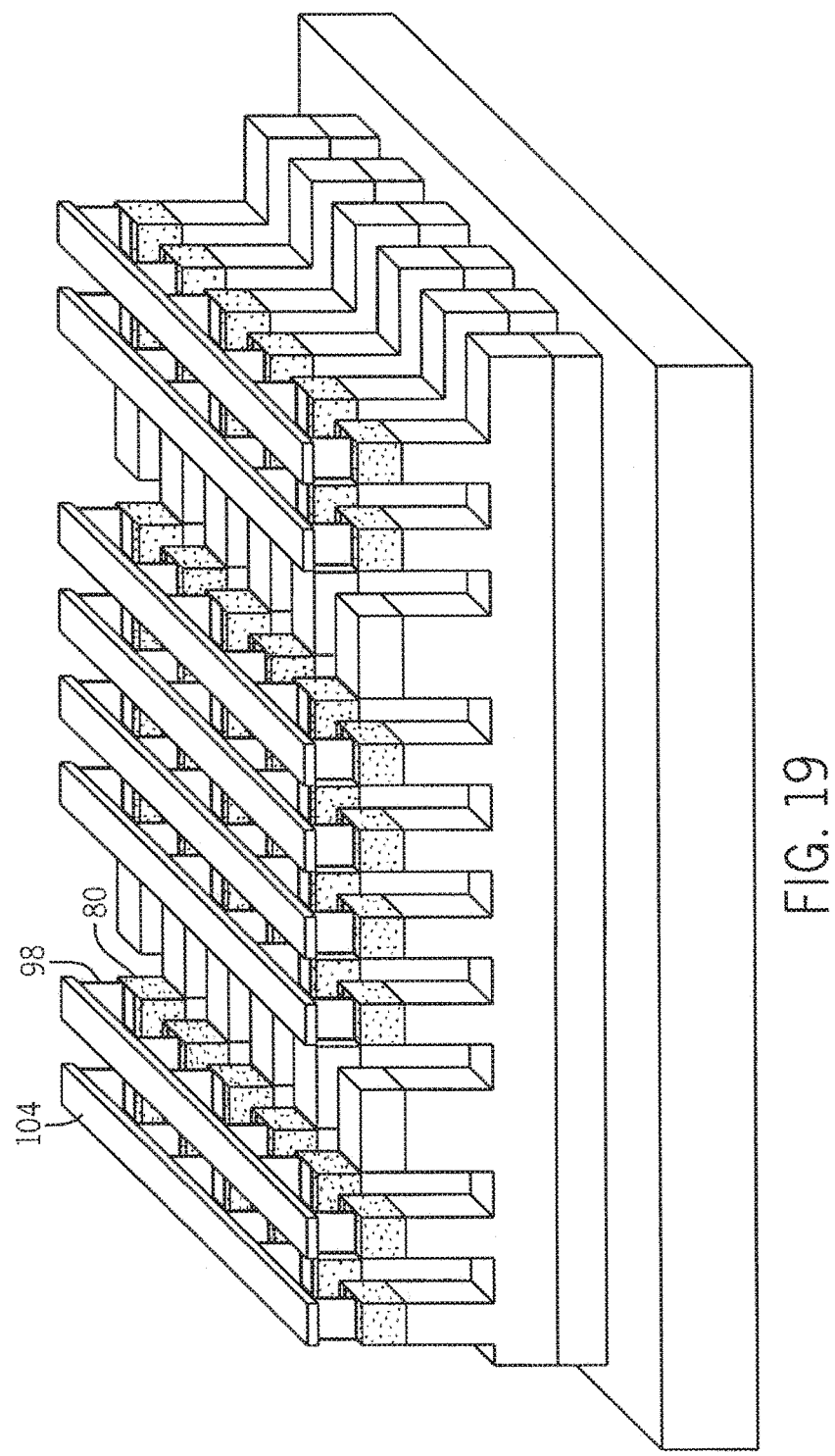
FIG. 19 is an enlarged, perspective view of the main array in accordance with one embodiment at a stage subsequent to that shown in FIG. 14.

Referring to FIG. 19, overlying layers have been removed in the perspective depiction to show the arrangement of the chalcogenide layers 104. As shown there, the chalcogenide layers extend only over the emitters 80 and make contact with the now singulated heaters 98. Note that the heaters were singulated during the self-aligned bitline etch. Thus, the chalcogenide layers run in the bitline direction, as indicated in FIG. 19.

Figure 20:
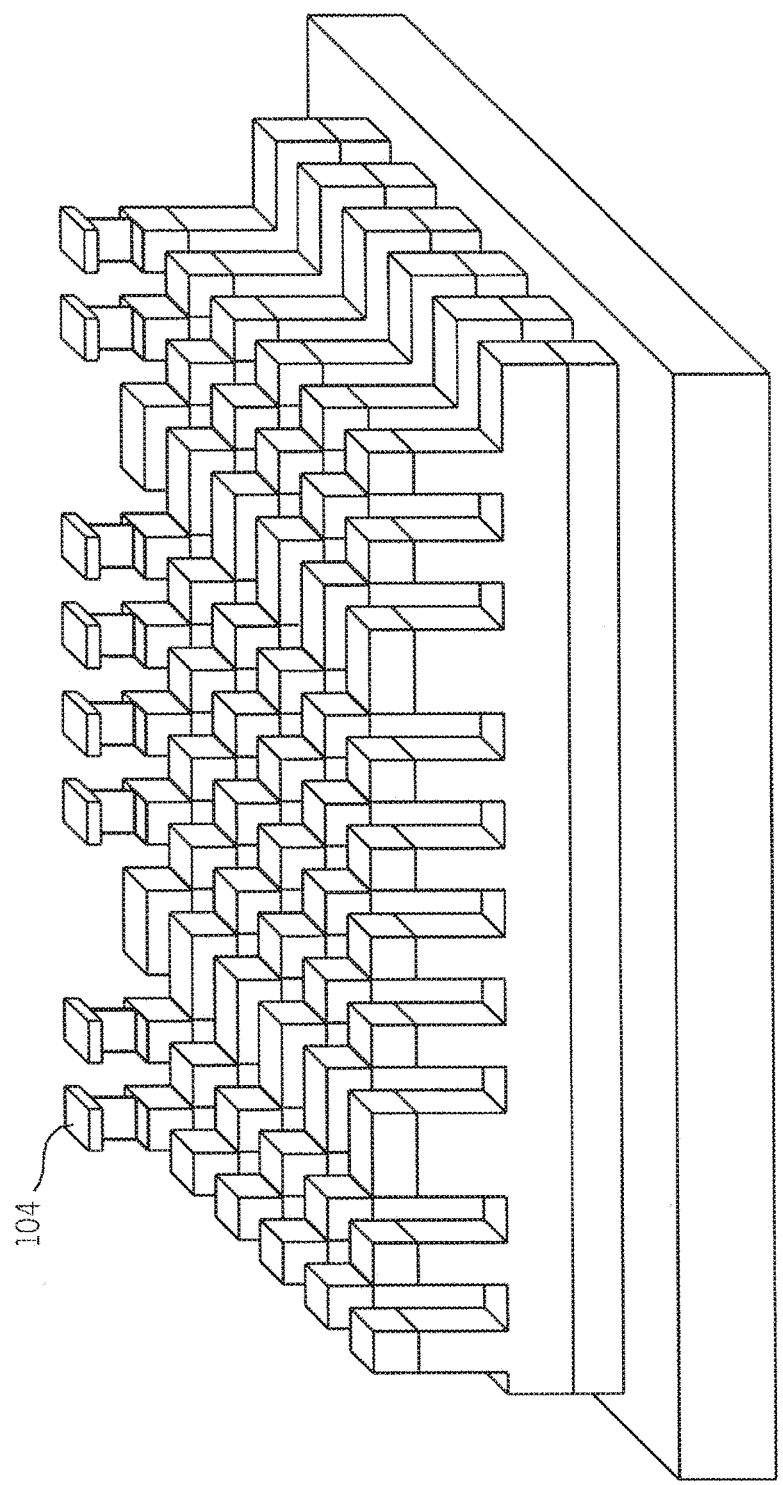
FIG. 20 is an enlarged, perspective view at a stage subsequent to that shown in FIG. 14 in accordance with one embodiment.

FIG. 20 shows the corresponding structure in the fuse array. Note that in the fuse array, there is a partial self-aligned bitline etch which leaves only portions of the chalcogenide layer 104 along a first wordline at the edge of the array.

Thereafter, conventional steps may be utilized to form copper damascene lines in the row and bitline directions on the fuse and main arrays in some embodiments.

In accordance with another embodiment, a resistive random access memory (ReRAM) main array and fuse array may be made on the same silicon substrate. In some embodiments, process complexity may be reduced and efficiencies may be achieved by using similar processing techniques for both the fuse array and the main array, despite the structural differences between the two arrays. In addition, it is advantageous to form only one fuse per bitline in accordance with some embodiments where the selecting transistor is realized at the array edge. The missing fuses on each bitline then provide spacing between adjacent fuses, which may reduce shorts or damage when fuses are blown, in some embodiments.

In some cases, the word lines may be tied together. A vector arrangement may use common word lines, with fuses driven by drivers along the edge of the fuse array rather than drivers under the fuses. As a result, the row parasitic resistance of each fuse may be reduced, improving performance in some embodiments.

Figure 21:
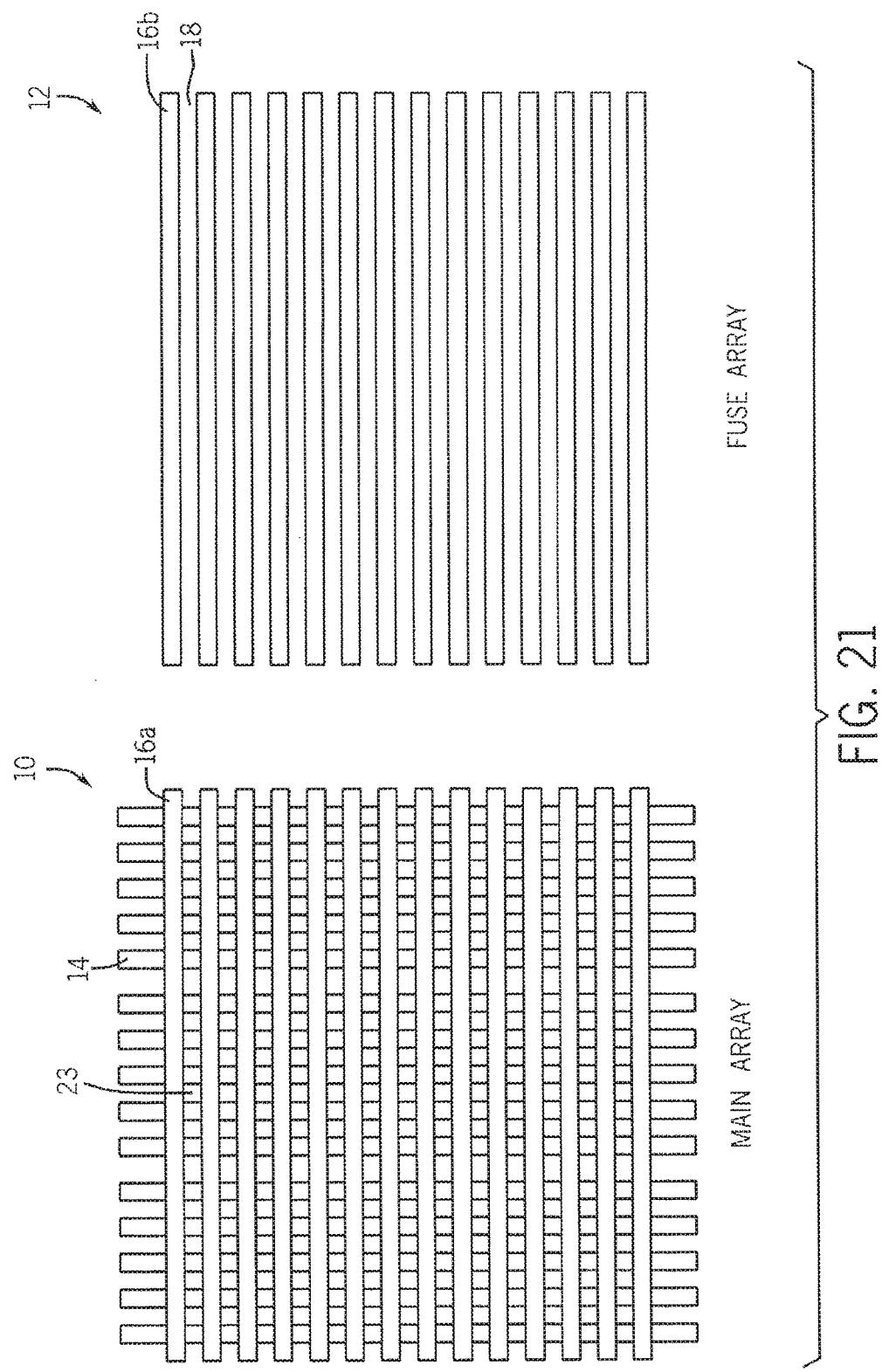
FIG. 21 is an enlarged, top plan view of the isolation structures for the main array (on the left) and the fuse array (on the right) in accordance with one embodiment.

Referring to FIG. 21, the main array, including the ReRAM cells, may include spaced, parallel, shallower trench isolations 14 and perpendicular spaced, parallel, deeper isolations 16a. The isolations 14 or 16a may be in the form of trenches in a semiconductor substrate, those trenches being filled with a dielectric. A cell active area may be defined at the intersection between two adjacent deeper trench isolations 16a and between two adjacent shallower trench isolations 14. Below each cell active area 23 may be a select transistor (not shown in FIG. 21) in the form of a bipolar junction transistor in one embodiment. A resistive random access memory element may be formed directly over the select transistor, in some embodiments. That is, in some embodiments, each ReRAM cell includes its own underlying select transistor. Other main array configurations may also be used.

In the fuse array 12, shown on the right side in FIG. 21, there is only one set of spaced, parallel trench isolations 16b. The trench isolations 16b correspond to the shallower trench isolations 16a in the main array. However, the perpendicular trench isolations 14 may be omitted in the fuse array and, instead, the fuse array may include word lines 18 that extend continuously between adjacent trench isolations 16b. Thus, in contrast to the main array, the fuse array uses continuous word lines that simultaneously drive many fuse cells along a row for example, while the main array includes a series of individual bipolar junction transistors that drive each cell, in some embodiments.

Advantageously, in some embodiments, the use of continuous, low resistance word lines may reduce the parasitic resistance of the fuse array. The resistance may be important in the fuse array because of the need for relatively high currents to destructively program the fuses in the fuse array. In some embodiments, the fuses may be programmed by passing a reverse biased high current through them, causing destructive failure. As a result, the fuses are either unprogrammed or programmed by causing the fuses to fail by the passage of relatively high current. In one embodiment, the word lines 14 may be formed of silicide such as cobalt silicide, formed on top of the same semiconductor substrate in which the trenches were formed.

Figure 22:
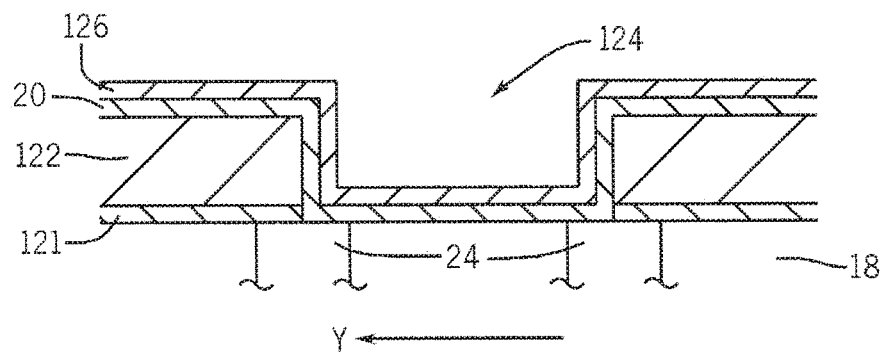
FIG. 22 is an enlarged, cross-sectional view showing the heater deposition according to one embodiment.

Then, in FIG. 22, a heater layer 20 and, optionally, a dielectric sheath layer 126, both having sublithographic thickness, are conformally deposited on the wafer 100. The heater layer 20 may constitute a plurality of parallel, spaced strips running in the bitline direction indicated as "Y" in FIG. 22. In a phase change memory embodiment, the strips 20 may be formed of a heater material. For example, the heater material may produce Joule heat in response to current flow. In embodiments using non-phase change resistive random access memories and, in some phase change memory embodiments, the heater material may be replaced by corresponding strips of conductive material and, in some cases, no heater may be used. The same masks may be used to produce the strips in the fuse array and the main array. The thickness of the heater layer 20 may be in the range of 5-20 nm in some embodiments.

The heater layer 20 may be formed over a dielectric layer 18 in which are formed contacts 24 which, in some embodiments, may be either base contacts or emitter contacts of a bipolar select transistor. The trench 124 in overlying dielectric layers 121 and 122 enables heaters to make an electrical connection to the contacts 24.

The heater layer 20 and the sheath layer 126 are etched back and flat portions thereof are removed from the bottom of the heater trench 124, as illustrated at 127 in FIG. 3. In practice, vertical portions of the heater layer 20 and of the sheath layer 126 adhering to sides of the heater trenches 124 are separated from each other and define heater strips 20' and sheath portions 126', respectively, extending in the row direction. Therefore, the second dielectric layer 122 outside the heater trenches 124, and the first dielectric layer 18, the base contacts 24a and the emitter contacts 24b inside the heater trenches 124 are exposed again. The heater strips 20' are in the form of rectilinear vertical walls, miming perpendicular to the column direction Y and having small lateral protrusions at bottom. In practice, two separate heater strips 20' are obtained from the heater layer 20 in each heater trench 124; each of the heater strips 20' extends on a respective row of selection transistors and is isolated from any other heater strips 20' of the wafer 52. A filling layer (not shown) is deposited on the wafer 52 and removed from outside the heater trenches 124 by chemical mechanical planarization. Hence, the heater trenches 124 are tilled by filling portions 127 of the filling layer, illustrated by a dashed line in FIG. 23.

Referring next to FIG. 24, a portion of the main or fuse array is shown at an early stage of fabrication. In each array, an etch mask (not shown) extending in the same direction as the shallow trench isolations 16a forms a plurality of parallel, spaced heater strips 20'.

Next, a plurality of layers may be built up over the strips 20'. For a phase change memory, a phase change material, such as GST, may be deposited as one of those layers, followed by other suitable layers, including a conductive cap and, in some embodiments, a metal line, such as a copper metal line. In other resistive memories, a different switching material, such as nickel oxide, titanium dioxide, silicon dioxide, or MnOx may be used, to mention a few examples.

Then, a mask (not shown) extending perpendicularly to the mask used to form the strips 20' (shown in FIG. 24), may be used to form the parallel, spaced lines 22 shown in FIG. 25. Thus, the stack of deposited layers, including a switching material, is etched, leaving the underlying or masked portions 20a of the strips 20' and also defining lines 22 that actually include the switching material for the fuse and main array cells. The lines 22 extend perpendicularly to the original lengths of strips 20', which now have been segmented into discrete heaters 20a, each coupled to an external select transistor (not shown in FIG. 23), an underlying heater 20a in a phase change memory application, and an overlying ReRAM cell (not shown in FIG. 23). The main array cells 27 may include a chalcogenide in the case of a phase change memory or a resistive switching material in the case of a resistive random access memory other than a phase change memory. Thus, in the main array, the regular matrix of cells 27 may be formed, each cell being equidistantly spaced from its adjacent cells in a grid pattern in some embodiments.

Figure 23:
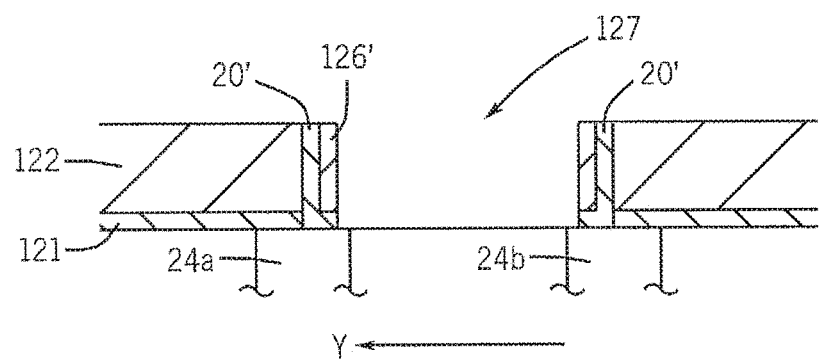
FIG. 23 is an enlarged, cross-sectional view showing the heater etching according to one embodiment.

Referring to FIG. 26, at the same time, using the same masks used in FIG. 23, a different structure is achieved in the fuse array. In the fuse array, the same depositions are applied to form the same stack as in the main array, but the depositions are patterned differently in a direction transverse to the length of the lines 22 shown in FIG. 23. As a result, the lines 22 have different lengths and are interrupted by a gap G in the vertical direction in FIG. 26.

That is, every other line 22a is longer in the vertical or bitline direction than the adjacent lines 22b on top of the gap G. Below the gap G, the lines 22c continue the lines 22a and the lines 22d continue the lines 22b. Thus, each longer line 22a on the top is aligned with a shorter line 22c below the gap G. Likewise, each shorter line 22b on top is aligned with a longer line 22d below the gap G.

As a result, cells 26 are only formed where the longer lines 22a or 22d overlap the heaters 20a. A complete grid pattern of cells is not achieved in the fuse array because, on alternate lines 22b and 22c, fuse cells are not formed. This provides some spacing between the adjacent fuses, which may improve reliability in some embodiments. That is, the adjacent neighbors of each existing fuse are removed so that there is greater spacing from one fuse to the next.

Moreover, for each line 22 extending in the vertical or bitline direction, only one fuse 26 is formed in some embodiments. Particularly, as explained in greater detail hereafter, for each of the lines 22b or 22c no fuse is formed, but a fuse is formed on the opposite side of the gap G on the opposite side of the fuse array on the lines 22a and 22d. As a result, only one fuse is formed per vertical line 22a/22c or 22b/22d in some embodiments. Each line 22a/22c and 22b/22d may correspond to a bitline in some embodiments.

Figure 27:
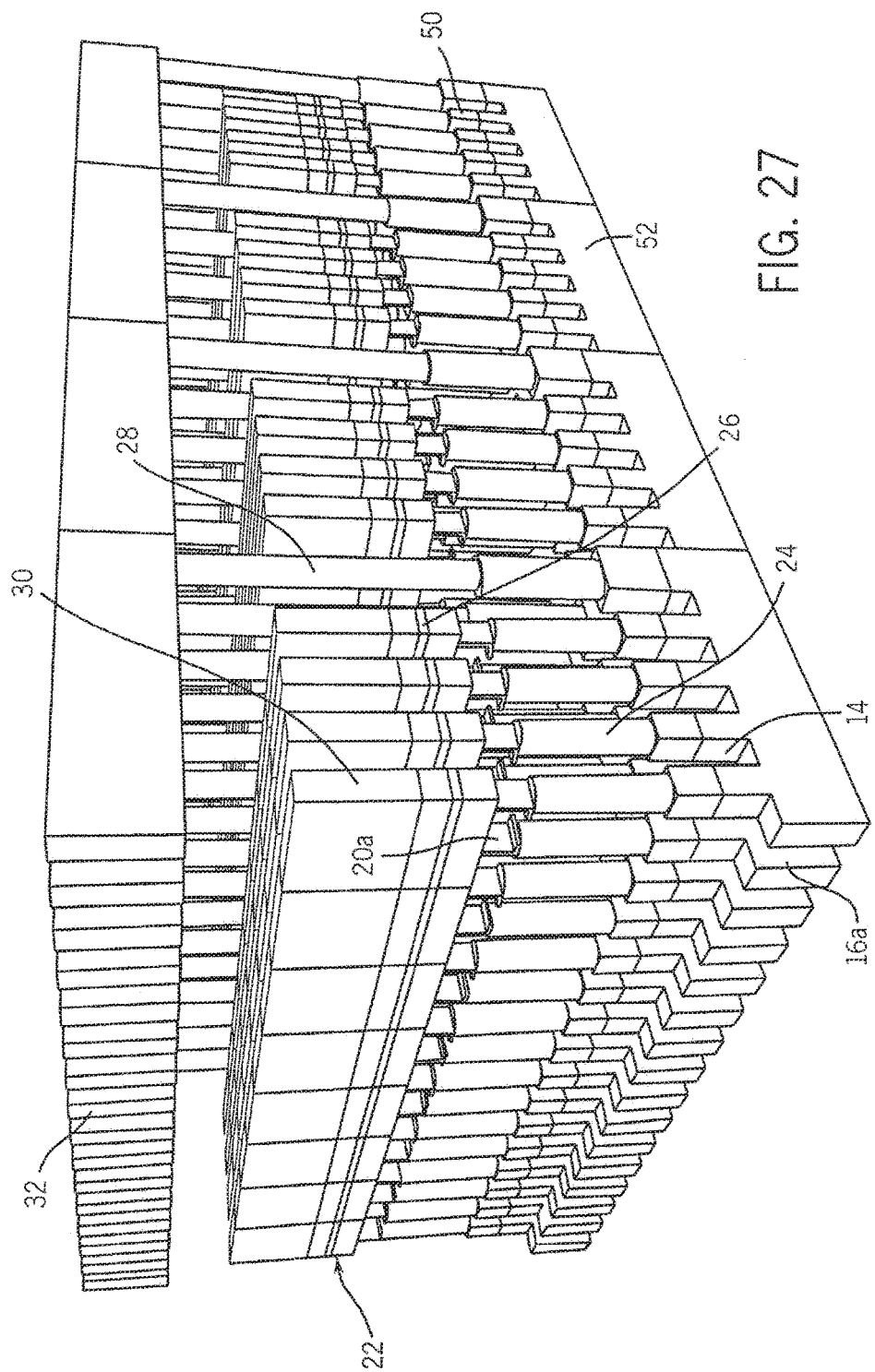
FIG. 27 is a greatly enlarged, perspective view of the main array at a subsequent stage in accordance with one embodiment.

Moving to FIG. 27, the main array includes the deeper isolations 16a running from the left side inwardly, while the shallower isolations 14 nm from the right side into the page. A plurality of pillar shaped contacts 24, which may be tungsten contacts, may connect to silicided regions 50, segmented by the shallower isolations 14.

Above the contacts 24 may be the heaters 20a, in a phase change memory embodiment. The switching material 26, in the case of a phase change memory embodiment, may be a chalcogenide plus an overlying conductive cap in some embodiments. Overlying the switching material 26 is the first metallization layer 30 that may be copper, in some embodiments, that forms metal bitlines in some embodiments.

As a result, each main memory cell 27 may be selected by a select transistor, including a region 50, formed in the substrate 52. This means that each memory cell 27 in the main array may be individually addressed and accessed from below. However, the cells in each bitline are continuously formed so they are unsegmented, while segmentation between adjacent cells occurs only in the word line direction.

Straps 28, in the form of vertical vias, may connect the select transistors in the substrate 52 to the metallization (M2) 32 in some embodiments. The M2 lines 32 are, therefore, removed from the array and, therefore, may be wider (or may be formed by 20 multiple lines), reducing their resistance.

The heaters 20a are self-aligned to each cell 27 since the heaters 20a are segmented by the same etch used to segment the bitlines, in some embodiments.

Below the contacts 24, the bipolar select transistors may be segmented by the perpendicular trenches 14 and 16a in the substrate 52. The bipolar select transistors each include a region 50 which may be formed of silicide.

Referring to FIG. 28, in the fuse array, fuse cells 26a and 26b are defined overheaters 20a. Intermediate between the two cells 26a and 26b, as indicated by 34, a heater and the overlying portion of the cell are missing. That is, a fuse is missing between two adjacent fuses 26a and 26b. This missing fuse and heater were removed by the etch that fanned the shortened lines 22b and 22c shown in FIG. 26. The fuses 26a and 26b are formed where the longer lines 22a overlap the heaters 20a, as shown in FIGS. 24 and 26. Similarly, another fuse is missing to the right of the fuse 26b in this embodiment, corresponding to the shortened line 22b in FIG. 26.

In some embodiments, the length of the switching material 26 and the bitline 30 may be the same. In another embodiment, the bitline 30 may be continuous (unlike what is shown in FIG. 8), while the switching material is discontinuous, as shown in FIG. 8.

In some embodiments, the silicidation that forms the contacts 50 in the main array also forms the word lines 18 in the fuse array.

An alternating arrangement of fuses is shown in FIG. 29, where only one fuse 26 is formed on each line 22. In some embodiments, a select transistor 40 is provided for each fuse along the edge of the fuse array. This means that a select transistor 40 is provided for each line 22a or 22d on one or the other side of the fuse array. In general, a fuse and a transistor 40 for that fuse may be on the same side of the fuse array in some embodiments. As a result, the resistance due to line length is reduced in some embodiments.

Each fuse cell 26 is coupled to one line 22 and each line 22 has only one fuse 26 per line 22 in one embodiment. All of the word lines 18 in the fuse array are connected to a common bias and include no decoder in one embodiment. Each of the select transistors 40 maybe a NMOS transistor in one embodiment. The gates of the transistors 40 may be coupled to a decoder.

In some embodiments, NMOS transistor selectors 40 can be formed in the fuse array along the edges of the fuse array. This enables the use of NMOS selectors 40 in the fuse array because they can be formed out from under the fuses. At the same time, bipolar junction select transistors can be fanned under each main array cell.

In some embodiments, the fuse array is much smaller with respect to the main array even though the cell density of the fuse array is lower. Enlarging the size of the fuse array may improve reproducibility in some embodiments.

Programming to alter the state or phase of the material may be accomplished by applying voltage potentials to bottom and top electrodes, thereby generating a voltage potential across a memory element including a resistive switching material. Considering the case of phase change memories, when the voltage potential is greater than the threshold voltages of any select device and memory element, then an electrical current may flow through a heater and the switching material in response to the applied voltage potentials, and may result in heating of the switching material.

This heating may alter the memory state or phase of the switching material, in one phase change memory embodiment. Altering the phase or state of the material 16 may alter the electrical characteristic of memory material, e.g., the resistance or threshold voltage of the material may be altered by altering the phase of the memory material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus, comprising:
an array of resistive memory elements formed on a substrate, wherein the array includes first and second sets of parallel trenches, and wherein the second set of parallel trenches is orthogonal to the first set of parallel trenches; and
a fuse array formed on the substrate, wherein the fuse array includes a third set of parallel trenches and a continuous wordline configured to drive one or more cells of the fuse array.

2. The apparatus of claim 1, wherein the first set of parallel trenches is shallower than the second set of parallel trenches.

3. The apparatus of claim 1, wherein the one or more cells of the fuse array are programmable by a reverse bias current.

4. The apparatus of claim 3, wherein the reverse bias current causes destructive failure of the one or more cells in the fuse array.

5. The apparatus of claim 1, wherein the third set of trenches define a plurality of address lines of the fuse array; and
each cell of the one or more cells of the fuse array corresponds to an address line of the plurality of address lines.

6. The apparatus of claim 1, wherein each cell of the one or more cells of the fuse array comprises a singulated heater.

7. The apparatus of claim 1, wherein the array of resistive memory elements and the fuse array are formed on a common die.

8. An apparatus comprising:
a chalcogenide memory array formed on a substrate and having a first set of trenches and a second set of trenches orthogonal to the first set of trenches;
a fuse array formed on the substrate and having continuous wordlines configured to drive one or more cells of the fuse array.

9. The apparatus of claim 8, wherein the first set of trenches are deeper than the second set of trenches.

10. The apparatus of claim 8, wherein the one or more cells of the fuse array each comprise a fuse contact.

11. The apparatus of claim 8, wherein the continuous wordlines are configured to reduce parasitic resistance in the fuse array.

12. The apparatus of claim 8, wherein the fuse array is programmable by applying a reverse biased current to the one or more cells of the fuse array.

13. The apparatus of claim 8, wherein the fuse array further comprises a third set of trenches defining the continuous wordlines.

14. The apparatus of claim 13, wherein the third set of trenches are extensions of the first set of trenches.

15. A method comprising:
forming a first set of trenches having a first depth;
forming a second set of trenches having a second depth, wherein the second set of trenches is perpendicular to the first set of trenches to define an array of resistive memory elements; and
forming a third set of trenches having the first depth to define a fuse array having continuous wordlines configured to drive one or more cells of the fuse array.

16. The method of claim 15, wherein each cell in the fuse array comprises a collector, the continuous wordline, a fuse contact, and a cap over the fuse contact.

17. The method of claim 16, further comprising:
forming a heater over at least a portion of the cap for each cell in the fuse array.

18. The method of claim 17, wherein the heater is L-shaped.

19. The method of claim 18, further comprising:
forming a chalcogenide layer over the heater.

20. The method of claim 19, further comprising:
etching the chalcogenide layer to leave portions of the chalcogenide layer over only a first wordline at an edge of the fuse array.

* * * * *